United States Patent
Wang et al.

(10) Patent No.: US 6,414,534 B1
(45) Date of Patent: Jul. 2, 2002

(54) LEVEL SHIFTER FOR ULTRA-DEEP SUBMICRON CMOS DESIGNS

(75) Inventors: Wen-Tai Wang, Taipei; Chung-Hui Chen, Hsin-Chu, both of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/784,819

(22) Filed: Feb. 20, 2001

(51) Int. Cl.[7] ................................................. H03L 5/00
(52) U.S. Cl. .......................... 327/333; 327/55; 327/437; 326/68; 326/81
(58) Field of Search ............................ 327/333, 52, 55, 327/57, 427, 434, 437; 326/63, 68, 80, 81

(56) References Cited

U.S. PATENT DOCUMENTS

| | | | |
|---|---|---|---|
| 5,153,451 A | 10/1992 | Yamamura et al. | 307/279 |
| 5,450,357 A | 9/1995 | Coffman | 365/189.11 |
| 5,539,334 A | 7/1996 | Clapp, III et al. | 326/68 |
| 5,698,993 A | 12/1997 | Chow | 326/81 |
| 5,705,946 A | 1/1998 | Yin | 327/333 |
| 5,729,155 A | 3/1998 | Kobatake | 326/68 |
| 5,821,800 A | 10/1998 | Le et al. | 327/333 |
| 5,892,302 A * | 4/1999 | Yawata et al. | 327/333 |
| 5,892,371 A | 4/1999 | Maley | 326/81 |
| 5,917,339 A | 6/1999 | Kim | 326/68 |
| 5,963,054 A | 10/1999 | Cochran et al. | 326/68 |
| 5,963,061 A | 10/1999 | Briner | 327/55 |
| 5,982,692 A * | 11/1999 | Lattimore et al. | 327/57 |
| 6,043,698 A | 3/2000 | Hill | 327/333 |
| 6,043,699 A * | 3/2000 | Shimizu | 326/80 |
| 6,307,398 B2 * | 10/2001 | Merritt et al. | 326/68 |

* cited by examiner

Primary Examiner—Terry D. Cunningham
Assistant Examiner—Long Nguyen
(74) Attorney, Agent, or Firm—George O. Saile; Stephen B. Ackerman; Douglas R. Schnabel

(57) ABSTRACT

New level shifting circuits, one using dynamic current compensation and one using dynamic voltage equalization, are described. An input swings between a low supply and ground. An output swings between a high supply and ground. An inverter input is connected to the input of the level shifting circuit to form an inverted level shifting input. A first NMOS transistor has the gate tied to the level shifting input and the source tied to ground. A first PMOS transistor has the gate tied to the level shifting output, the source tied to the high supply, and the drain tied to the first NMOS drain. A second NMOS transistor has the gate tied to the inverted level shifter input, the source tied to the ground, and the drain tied to the level shifting output. A second PMOS transistor has the gate tied to the first NMOS drain, the source tied to the high supply, and the drain is tied to the level shifting output. A third NMOS transistor has the gate tied to the first NMOS drain, v source tied to the level shifting input, and the drain tied to the level shifting output. A fourth NMOS transistor has the gate tied to the second NMOS drain, the source tied to the inverted level shifting input, and the drain tied to the first NMOS drain.

7 Claims, 4 Drawing Sheets

LEVEL SHIFTER FOR ULTRA-DEEP SUBMICRON CMOS DESIGNS

BACKGROUND OF THE INVENTION (1) Field of the Invention

The invention relates to digital integrated circuits, and more particularly, to a circuit that allows a digital signal to be level shifted from a low voltage supply to a high voltage supply.

(2) Description of the Prior Art

Ultra deep submicron CMOS technologies are used to create digital integrated circuits with very high transistor densities and very high switching speeds. These submicron CMOS transistors have very thin gate oxide and very low threshold voltages. To facilitate use of ultra deep submicron CMOS processes, the supply voltage for the high density logic core must be lowered to improve device reliability. Supply voltages of between about 2.5 Volts and 3.3 Volts, which have been typical for prior art CMOS logic devices, have to be reduced to a low voltage regime of, for example, between about 0.9 Volts and 2.5 Volts.

While the supply voltage of the core logic section is being reduced, the supply voltage for the input/output section of the integrated circuit must be kept at a higher level to assure adequate signal-to-noise ratio and compatibility with other devices. Where digital signals in the low voltage core must be transmitted off the integrated circuit, signal level shifting is therefore necessary. A level shifting circuit is used to increase the upper voltage swing of the low voltage signal, from a low voltage to a high voltage.

Figure 1:
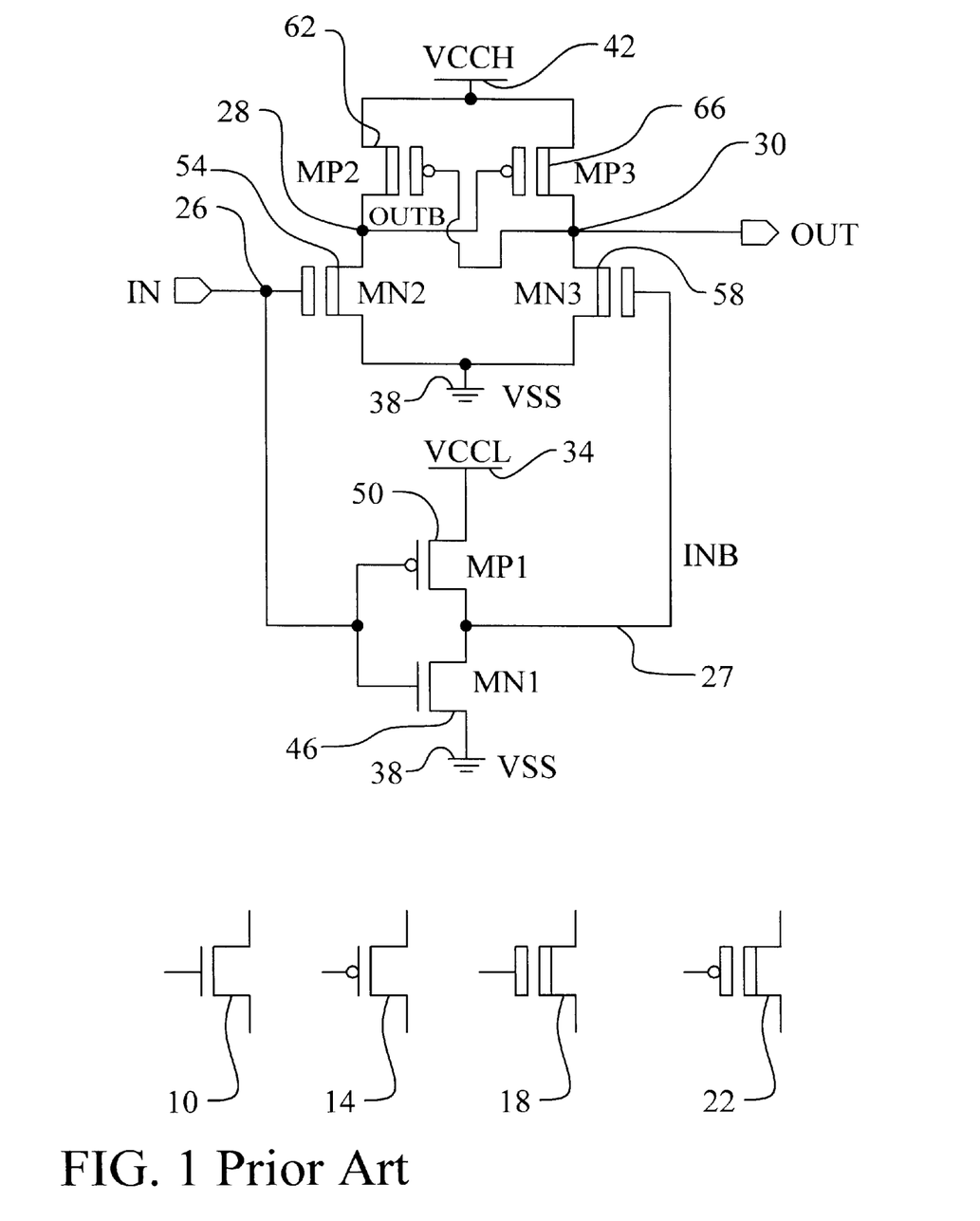
FIG. 1 illustrates a schematic of a prior art level shifting circuit.

Referring now to FIG. 1, a prior art level shifting circuit is shown. This level shifting circuit uses four types of transistors. Low voltage NMOS transistors 10 and low voltage PMOS transistors 14 are used in the low supply voltage VCCL 34 section. High voltage NMOS transistors 18 and high voltage PMOS transistors 22 are used in the high supply voltage VCCH section. The low voltage transistors 10 and 14 have a thinner gate oxide than the high voltage transistors 18 and 22. In addition, the low voltage transistors 10 and 14 have a low threshold voltage of between about 0.2 Volts and 0.35 Volts for NMOS 10 and between about −0.2 Volts and −0.35 Volts for PMOS 14. High voltage devices have a threshold voltage of between about 0.4 Volts and 0.7 Volts for NMOS 18 and between about −0.4 Volts and −0.7 Volts for PMOS 22.

The prior art level shifting circuit uses an inverter made up of transistors MN1 46 and MP1 50 and a differential pair made up of transistors MN2 54, MN3 58, MP2 62, and MP3 66. Generally, the low voltage supply VCCL 34 is biased at between about 0.9 Volts and 2.5 Volts. The high voltage supply VCCH 42 is biased at between about 3 Volts and 5 Volts. The purpose of the level shifting circuit is to convert the input signal IN 26 from a swing of between 0 Volts and VCCL 34 to a swing of between 0 Volts and VCCH 42 at the output node OUT 30.

The prior art level shifting circuit exhibits dc voltage and transistor switching characteristics according to Table 1 below:

Note that the prior art level shifting circuit exhibits no dc static current consumption. Since the input signal IN 26 only connects to the gates of transistors MN1 46, MP1 50, and MN2 54, there is no dc input leakage path. Only one of the inverter pair MN1 46 and MP1 50 is ON in either state. Therefore, there exists no static current path from VCCL 34 to VSS 38. Finally, since only the pair MN2 54 and MP3 66 or the pair MN3 58 and MP2 62 are ON at any given time, there exists no static current path between VCCH and VSS.

Note also that the high supply voltage VCCH is only applied to the thick oxide devices MN2 54, MN3 58, MP2 62 and MP3 66. Therefore, reliability concerns for the thin oxide devices are eliminated.

To illustrate the ac performance of the prior art level shifting circuit, consider the case of the input signal IN 26 switching from VSS to VCCL. First, transistor MN2 54 turns ON. At this point, transistor MP2 62 remains ON. Therefore, while MN2 54 is driving node OUTB 28 to VSS, MP2 62 is concurrently driving node OUTB 28 to VCCL. After transistor MP1 50 turns OFF, the inverter output INB 27 transitions to VSS. Transistor MN3 58 is therefore turned OFF. Finally, once the voltage at node OUTB 28 is discharged, transistor MP3 66 is turned ON. MP3 66 drives the output node OUT 30 to VCCH and turns OFF MP2 62.

An analysis of the ac operation of the prior art level shifting circuit reveals a serious switching delay when the design is used in an ultra-deep submicron process. In such processes, the VCCL 34 voltage is very small to facilitate the usage of very small devices with very thin gate oxides, shallow junctions, and shrinking threshold voltages. However, the key input transistors of the circuit, MN2 54 and MN3 58, still have large voltage thresholds. Therefore, the $I_{dsat}$ of these thick gate NMOS devices, at the relatively small gate drive of VCCL, is also small. If, as in the example case, MN2 54 must drive node OUTB 28 against MP2 62, then the reduced $I_{dsat}$ of MN2 54 will cause the OUTB signal transition to take a long time.

In addition, since OUTB 28 initially remains at or near VCCH 42, transistor MP3 66 is OFF. At the same time, transistor MN3 58 is in the off-state once INB 27 discharges to VSS. In this condition, the output node OUT 30 is floating. The voltage level of OUT 30 will depend on the load and the reverse saturation current of the MP3 66 drain-to-N Well and the MN3 58 drain-to-P Well junction diodes during the transition time prior to MN2 54 discharging OUTB 28 to VSS.

Finally, the $I_{dsat}$ of MN2 54 and of MN3 58 may be made larger than the $I_{dsat}$ of MP2 62 and of MP3 66 by making MN2 and MN3 sufficiently large to overcome the relatively small gate drive. However, this adds substantially to the area required for the level shifting circuit. In addition, the parasitic capacitance from the gate of MP3 66 and the drain junction of MP2 62 must be discharged by MN2 54 during a transition.

Several prior art inventions describe circuits for level shifting and handling higher voltage supplies in low voltage CMOS applications. U.S. Pat. No. 6,043,699 to Shimizu describes level shifting circuits with higher speed or with

TABLE 1

| IN | INB | OUT | OUTB | MN1 | MP1 | MN2 | MN3 | MP2 | MP3 |
|---|---|---|---|---|---|---|---|---|---|
| VSS | VCCL | VSS | VCCH | OFF | ON | OFF | ON | ON | OFF |
| VCCL | VSS | VCCH | VSS | ON | OFF | ON | OFF | OFF | ON | extended operating ranges. U.S. Pat. No. 6,043,698 to Hill teaches a level shifting circuit using a latch and resistors in the interface section. U.S. Pat. No. 5,892,371 to Maley discloses a level shifting circuit configured to protect MOS transistors from gate oxide failure by limiting the voltage across any one transistor. U.S. Pat. No. 5,729,155 to Kobatake describes a level shifting circuit where an NMOS transistor and a PMOS transistor are connected in series between the top rail PMOS transistor and the bottom rail NMOS transistor. The additional transistors are biased to fixed voltage references to insure that each device is ON. The presence of the transistor pair reduces the voltage stress on each device in the stack. U.S. Pat. No. 5,539,334 to Clapp, III et al discloses a circuit, comprising low voltage components, that can be used with a high voltage supply. The level shifting circuit embodiment may accommodate multiple power supplies. U.S. Pat. No. 5,821,800 to Le et al teaches a level shifting circuit capable of high voltage operation using low voltage CMOS devices. One or more complementary NMOS and PMOS pairs are used between the top rail PMOS and the bottom rail NMOS transistors. The complementary devices are not self-biased. U.S. Pat. No. 5,153,451 to Yamamura et al describes a level shifting circuit that has a fail-safe mode. The output state is guaranteed high or guaranteed low if the input signal voltage falls below a predetermined level. U.S. Pat. No. 5,698,993 to Chow discloses a level shifting circuit where an NMOS transistor is added to each side of the differential pair to improve switching speed and symmetry. The gates of the added NMOS devices are biased to a constant low voltage supply. U.S. Pat. No. 5,705,946 to Yin teaches a two-stage level shifter using a voltage divider input. U.S. Pat. No. 5,917,339 to Kim describes a mixed voltage input buffer. U.S. Pat. No. 5,963,061 to Briner discloses a level shifting circuit using complementary NMOS and PMOS transistor pairs stacked between the rail devices as guard devices to limit high voltage exposure. The complementary pairs may be biased to the same constant voltage source or to independent constant voltage sources. U.S. Pat. No. 5,963,054 to Cochran et al teaches a circuit for switching voltages greater than the gate oxide breakdown of the MOS transistors will allow. A transistor pair is disposed between the PMOS and NMOS switching transistors. U.S. Pat. No. 5,450,357 to Coffman describes a level shifting circuit for selecting different voltage levels for programming memory cells.

SUMMARY OF THE INVENTION

A principal object of the present invention is to provide a level shifting circuit, that is, a circuit that allows a digital signal to be level shifted from a low voltage supply to a high voltage supply.

A further object of the present invention is to provide a level shifting circuit that can interface ultra-deep submicron devices and high voltage devices.

A yet further object of the present invention is to provide a level shifting circuit with higher switching speed.

Another yet further object of the present invention is to provide a level shifting circuit with a reduced area.

Another yet further object of the present invention is to provide a level shifting circuit with high reliability.

Another yet further object of the present invention is to provide a level shifting circuit with no static current draw.

In accordance with the objects of this invention, a new level shifting circuit, using dynamic current compensation, is described. An input swings between a low supply and ground. An output swings between a high supply and ground. An inverter has an input and an output. The input is connected to the input of the level shifting circuit, and the output forms an inverted level shifting input. A first NMOS transistor has the gate connected to the level shifting input and the source connected to ground. A first PMOS transistor has the gate connected to the level shifting output, the source connected to the high supply, and the drain connected to the first NMOS transistor drain. A second NMOS transistor has the gate connected to the inverted level shifting input, the source connected to ground, and the drain connected to the level shifting output. A second PMOS transistor has the gate connected to the first NMOS transistor drain, the source connected to the high supply, and the drain connected to the level shifting output. A third NMOS transistor has the gate connected to the first NMOS transistor drain, the source connected to the level shifting input, and the drain connected to the level shifting output. A fourth NMOS transistor has the gate connected to the second NMOS transistor drain, the source connected to the inverted level shifting input, and the drain connected to the first NMOS transistor drain.

Also in accordance with the objects of this invention, a new level shifting circuit, using dynamic voltage equalization, is described. An input swings between a low supply and ground. An output swings between a high supply and ground. An inverter has an input and an output. The input is connected to the input of the level shifting circuit, and the output forms an inverted level shifting input. A first NMOS transistor has the gate connected to the level shifting input and the source connected to ground. A first PMOS transistor has the gate connected to the level shifting output, the source connected to the high supply, and the drain connected to the first NMOS transistor drain. A second NMOS transistor has the gate connected to the inverted level shifting input, the source connected to ground, and the drain connected to the level shifting output. A second PMOS transistor has the gate connected to the first NMOS transistor drain, the source connected to the high supply, and the drain connected to the level shifting output. A transition pulse circuit has an output that is at ground during steady state and that pulses to the low supply for a short duration when the level shifting input changes state. A third NMOS transistor has the gate connected to the transition pulse circuit output, the source connected to the level shifting output, and the drain connected to the first NMOS transistor drain.

BRIEF DESCRIPTION OF THE DRAWINGS

In the accompanying drawings forming a material part of this description, there is shown.

DESCRIPTION OF THE PREFERRED EMBODIMENTS

The embodiments disclose the application of the present invention to a level shifting circuit combining low voltage and high voltage devices. It should be clear to those experienced in the art that the present invention can be applied and extended without deviating from the scope of the present invention.

Figure 2:
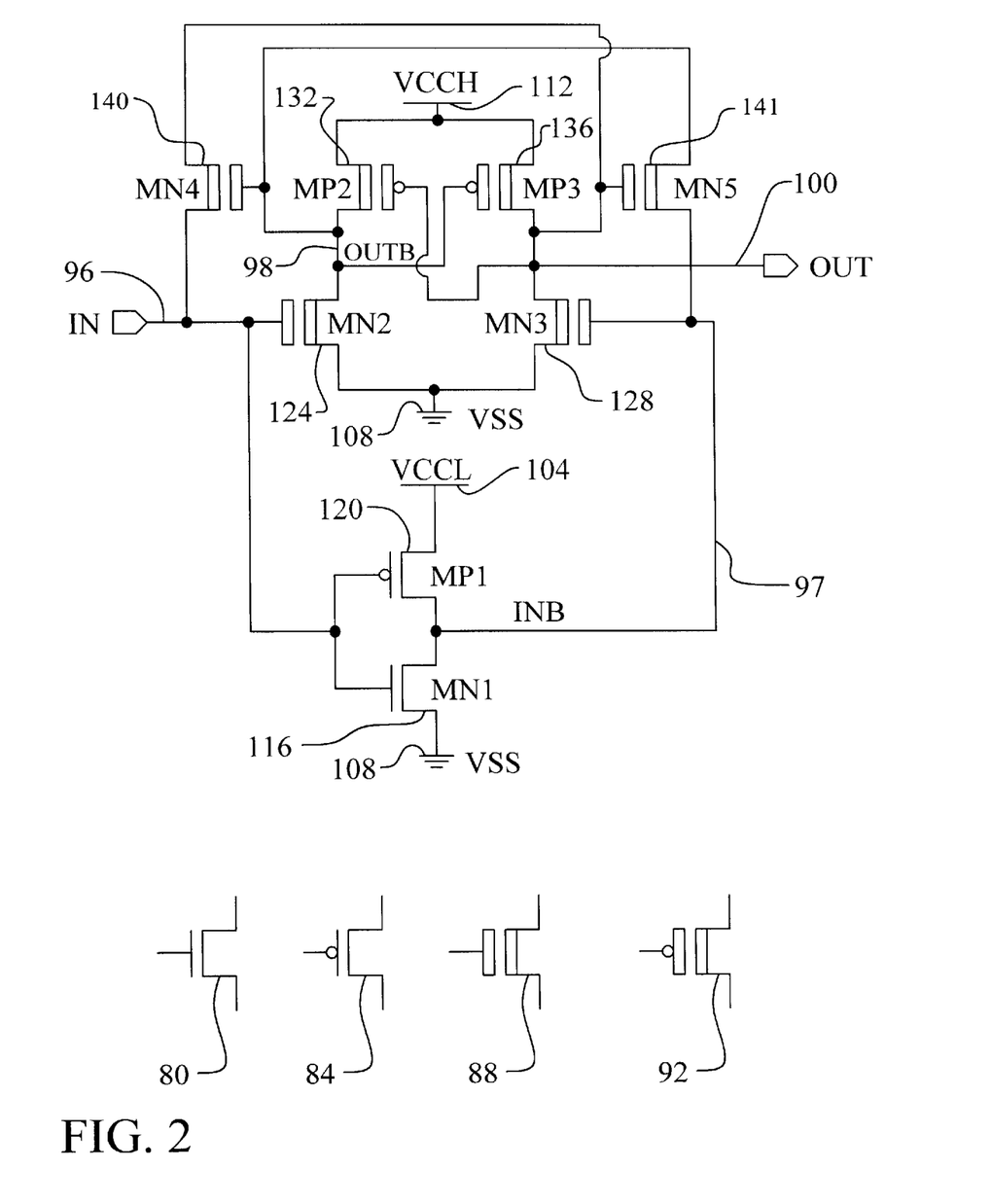
FIG. 2 illustrates a schematic of a first preferred embodiment of the present invention.

Referring now particularly to FIG. 2, there is shown a schematic of the first embodiment of the present invention. The first embodiment level shifting circuit uses a dynamic current compensation technique to reduce switching delay. The first embodiment circuit uses four types of MOS transistors. Low voltage NMOS 80 and PMOS 84 transistors are used. High voltage NMOS 88 and PMOS 92 transistors are also used. As in the prior art example, the low voltage transistors 80 and 84 have the thin oxide and the shallow junctions consistent with an ultra-deep submicron process. The low voltage NMOS devices 80 have voltage thresholds of between about 0.2 Volts and 0.35 Volts while the PMOS devices 84 have voltage thresholds of between about −0.2 Volts and −0.35 Volts. The low voltage transistors 80 and 84 have an operating range of up to about 2.5 volts before avalanche or gate oxide breakdown occurs.

The high voltage devices 88 and 92 have thicker oxide and deeper junctions so that these devices will withstand greater drain to source and drain to gate voltages without avalanche or gate oxide breakdown. The high voltage NMOS transistors 88 have a voltage threshold of between about 0.4 Volts and 0.7 Volts while the complementary PMOS transistors 92 have a voltage threshold of between about −0.4 Volts and −0.7 Volts. The high voltage transistors have an operating range of up to about 5 Volts and as high as about 30 Volts before avalanche or gate oxide breakdown occurs.

The purpose of the present invention is to increase the voltage swing of the signal IN 96 from the low supply voltage, or, simply, the low supply, which is labeled VCCL 104 to the high supply voltage, or, simply, the high supply, which is labeled VCCH 112. VCCL 104 is the voltage supply for the low voltage transistors that make up the core logic of an integrated circuit manufactured by the submicron process. The VCCL 104 supply voltage is designed to operate, for example, at between about 0.9 Volts and 2.5 Volts and as low as about 0.5 Volts. The IN signal 96 will therefore vary between about the ground reference, VSS 108, that is typically at 0 Volts, and the VCCL supply 104 level in the two digital states of low and high, respectively.

The high supply, or VCCH 112, is biased to operate at, for example, between about 3.0 Volts and 5.0 Volts, and as low as about 1 Volt and as high as about 30 Volts. This voltage level is used in the input/output (I/O) section of the integrated circuit and is consistent with the voltage level needed for compatibility outside the chip. The level shifted output signal, OUT 100, has a voltage swing of between VSS 108 and VCCH 112 for the digital low and high states, respectively. The level shifting circuit of the first preferred embodiment produces a level shift from the low voltage IN 96 signal to the high voltage OUT 100 signal while maintaining the logical state of the signal. A high level on IN 96 will generate a high level on OUT 100, while a low level on IN 96 will generate a low level on OUT 100.

An inverter is formed by the low voltage NMOS transistor MN1 116 and the low voltage PMOS transistor MP1 120. This inverter is powered by the VCCL supply 104. The gates of MN1 116 and MP1 120 are connected to the IN signal 96. The drains of the MN1 116 and MP1 120 are connected together and produce an inversion of the IN signal 96 that is labeled INB 97.

High voltage NMOS transistors MN2 124 and MN3 128 and high voltage PMOS transistors MP2 132 and MP3 136 form a differential pair configuration with connections like that of the prior art. Transistor MN2 124 has the gate connected to IN 96, the source connected to VSS 108, and the drain connected to the node OUTB 98. Transistor MN3 128 has the gate connected to INB 97, the source connected to VSS 108, and the drain connected to OUT 100. Transistor MP2 132 has the gate connected to OUT 100, the source connected to VCCH 112, and the drain connected to OUTB 98. Transistor MP3 136 has the gate connected to OUTB, the source connected to VCCH 112, and the drain connected to OUT 100.

Note the novel addition of two high voltage NMOS transistors, MN4 140 and MN5 141, to the circuit. Particularly, transistor MN4 140 has the gate connected to OUTB 98, the drain connected to IN 96 and the source connected to OUT 100. Transistor MN5 141 has the gate connected to OUT 100, the drain connected to INB 97, and the source connected to OUTB 98. The presence of transistors MN4 140 and MN5 141 produces a dynamic current compensation effect, during switching, that significantly improves the performance of the level shifting circuit while reducing the layout area.

The first embodiment level shifting circuit exhibits dc voltage and transistor switching characteristics according to Table 2 below:

TABLE 2

| IN | INB | OUT | OUTB | MN1 | MP1 | MN2 | MN3 | MP2 | MP3 | MN4 | MN5 |
| --- | --- | --- | --- | --- | --- | --- | --- | --- | --- | --- | --- |
| VSS | VCCL | VSS | VCCH | OFF | ON | OFF | ON | ON | OFF | ON | OFF |
| VCCL | VSS | VCCH | VSS | ON | OFF | ON | OFF | OFF | ON | OFF | ON |

Note that the level shifting circuit exhibits no dc static current consumption. Only one transistor of the inverter pair MN1 116 and MP1 120 is ON in either state. Therefore, there exists no static current path from VCCL 104 to VSS 108. Since only the pair MN2 124 and MP3 136 or the pair MN3 128 and MP2 132 are ON at any given time, there exists no static current path between VCCH and VSS. When transistor MN4 140 is ON, the drain and source are both already at VSS 108. Therefore, there is no static current flow. The same condition is true for MN5 141, where both drain and source are at VSS when this transistor is ON.

Note also that the high supply voltage VCCH 112 is only applied to the thick oxide devices MN2 124, MN3 128, MP2 132, MP3 136, MN4 140, and MN5 141. Therefore, reliability concerns for the thin oxide devices are eliminated.

To illustrate the ac performance of the first embodiment of the shifting circuit, consider the case of the input signal IN 96 switching from VSS to VCCL. First, the rise in gate voltage turns transistor MN2 124 ON. At this point, transistor MP2 132 also remains ON since the pre-switching bias of OUT 100 was low. Therefore, as in the prior art, the initial condition of the left side of the differential pair, after IN 96 switches states, is that MN2 124 is driving node OUTB 98 to VSS while MP2 132 is concurrently driving node OUTB 98 to VCCH.

The voltage change in IN 96 turns off transistor MP1 120 while transistor MN1 116 drives INB 97 to VSS. The loss of gate voltage causes transistor MN3 128 to turn OFF. Since the pre-switching bias on the gate of MP3 136 was VCCH, MP3 136 remains OFF. Therefore, the initial condition of the right side of the differential pair, after INB transitions low, is that both MN3 128 and MP3 136 are OFF. Therefore, without the dynamic current compensation of the first embodiment, the OUT node 100 would be floating as in the prior example. This combination of conditions for the left and right sides of the differential pair would lead to long switching delays.

However, the presence of the dynamic current compensation transistors, MN4 140 and MN5 141 drastically improves the switching speed. Continuing the analysis of the case where IN 96 switches from VSS to VCCL, note that the pre-switching bias of the gate of MN4 140 is VCCH. After IN 96 switches to VCCL, a large drain-to-source voltage exists across the transistor, MN4 140. MN4 140 is therefore turned slightly ON. MN4 140 will then provide a current source to begin charging up the OUT 100 node to VCCL voltage minus the threshold of MN4 (VCCL−$V_{tMN4}$). As the voltage of OUT 100 increases, the gate drive on MP2 132 is reduced and the $I_{dsat}$ of MP2 132 is reduced. MN2 is therefore able to more rapidly discharge the capacitance on the OUTB 98 to VSS. Finally, once the voltage at node OUTB 98 is sufficiently discharged, transistor MP3 136 is turned ON. MP3 136 drives the output node OUT 100 to VCCH and completely turns OFF MP2 132.

The case where IN 96 switches from VCCL to VSS works in similar fashion with transistor MN5 141 working as a dynamic current source to rapidly charge up the OUTB node 98 and thereby reduce the $I_{dsat}$ of MP3 136.

The analysis of the ac operation of the first embodiment level shifting circuit demonstrates how the design may be used in an ultra-deep submicron process to reduce switching delay. By adding dynamic current compensation through devices, MN4 140 and MN5 141, the problem of the low $I_{dsat}$ thick gate NMOS input devices, MN2 124 and MN3 128, is fixed. The circuit switches faster and demonstrates symmetric switching delays.

In addition, for a given switching speed requirement, MN2 124 and MN3 128 may be made substantially smaller than would be necessary in the prior art design. Even with the additional transistors, MN4 140 and MN5 141, the layout area required for the level shifting circuit is reduced.

Figure 3:
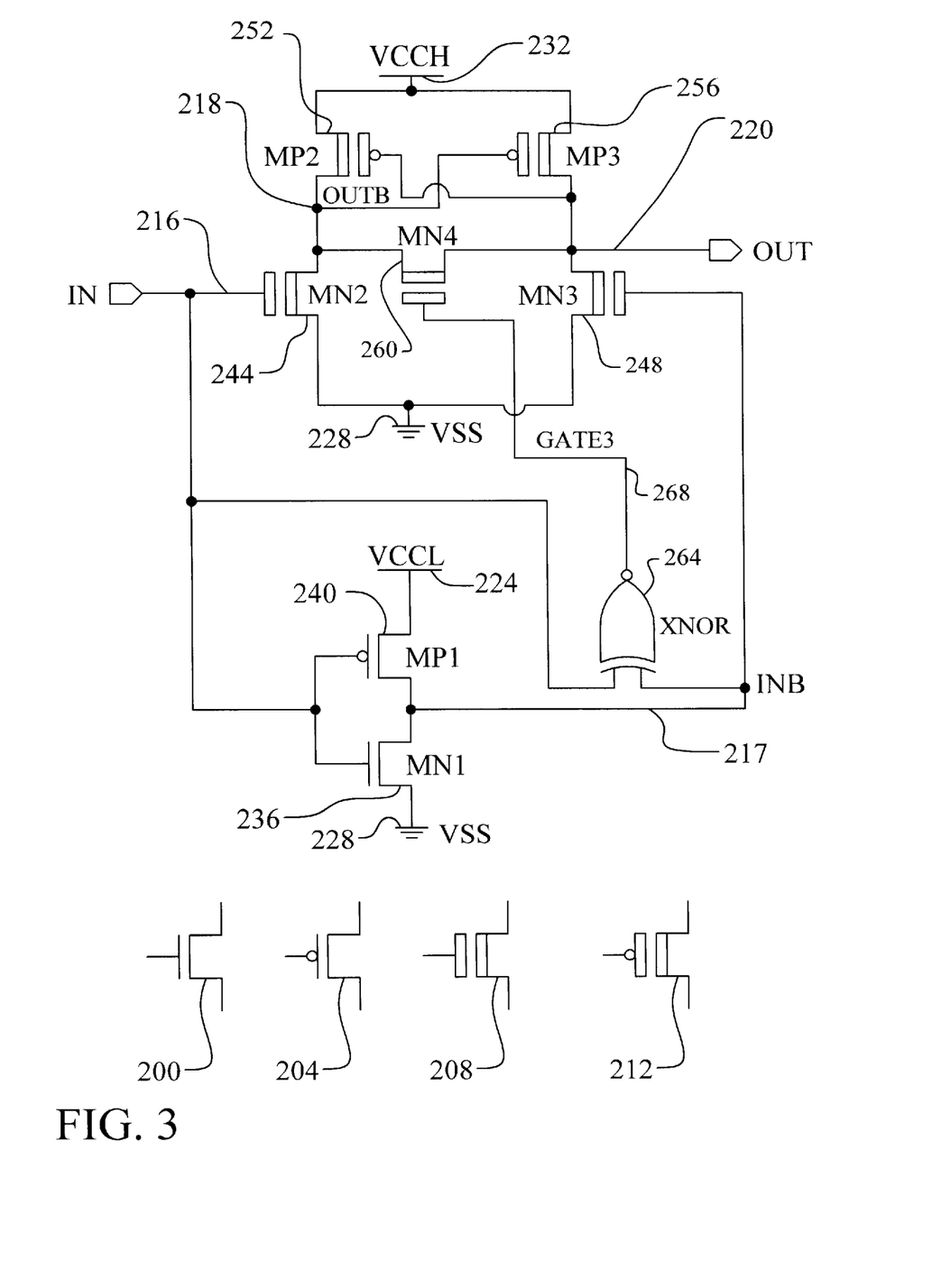
FIG. 3 illustrates a schematic of a second preferred embodiment of the present invention.

Referring now to FIG. 3, a second preferred embodiment of the present invention is illustrated in schematic form. The second embodiment level shifting circuit uses a dynamic voltage equalization technique to reduce switching delay. The second embodiment circuit again uses four types of MOS transistors. Low voltage NMOS 200 and PMOS 204 transistors are used. High voltage NMOS 208 and PMOS 212 transistors are also used. The low and high voltage transistors have the same properties as those described above in the first embodiment.

Once again, the purpose of the present invention is to increase the voltage swing of the signal IN 216 from the low supply, which is labeled VCCL 224, to the high supply, which is labeled VCCH 232. VCCL 224 is the voltage supply for the low voltage transistors that make up the core logic of an integrated circuit and is designed to operate at, for example, between about 0.9 Volts and 2.5 Volts, and as low as about 0.5 Volts. The IN signal 216 will therefore vary between about the ground reference, VSS 228, that is typically at 0 Volts, and the VCCL supply 224 level in the two digital states of low and high, respectively.

The high supply, or VCCH 232, is biased to operate at, for example, between about 3.0 Volts and 5.0 Volts, and as low as about 1 Volt and as high as about 30 Volts, for the input/output (I/O) section of the integrated circuit. The level shifted output signal, OUT 220, has a voltage swing of between VSS 228 and VCCH 232 for the digital low and high states, respectively. The level shifting circuit of the second preferred embodiment produces a level shift from the low voltage IN 216 signal to the high voltage OUT 220 signal while maintaining the logical state of the signal. A high level on IN 216 will generate a high level on OUT 220, while a low level on IN 216 will generate a low level on OUT 220.

An inverter is formed by the low voltage NMOS transistor MN1 236 and the low voltage PMOS transistor MP1 240. This inverter is powered by the VCCL supply 224. The gates of MN1 236 and MP1 240 are connected to the IN signal 216. The drains of the MN1 236 and MP1 240 are connected together and produce an inversion of the IN signal 216 that is labeled INB 217.

High voltage NMOS transistors MN2 244 and MN3 248 and high voltage PMOS transistors MP2 252 and MP3 256 form a differential pair configuration with connections like that of the prior art. Transistor MN2 244 has a gate connected to IN 216, a source connected to VSS 228, and a drain connected to the node OUTB 218. Transistor MN3 248 has a gate connected to INB 217, a source connected to VSS 228, and a drain connected to OUT 220. Transistor MP2 252 has a gate connected to OUT 220, a source connected to VCCH 232, and a drain connected to OUTB 218. Transistor MP3 256 has a gate connected to OUTB 218, a source connected to VCCH 232, and a drain connected to OUT 220.

A novel dynamic voltage equalization is added to the circuit through the addition of the transition pulse circuit 264, implemented herein as an exclusive NOR (XNOR) gate 264, and the high voltage NMOS transistor MN4 260. The transition pulse circuit 264 is a circuit with an output, connected to the node GATE3 268, that is normally at VSS and that pulses to VCCL for a short duration whenever a signal transition is sensed on the IN node 216.

The transition pulse circuit 264 may use any arrangement of transistor logic that produces such a transition pulse. In this embodiment example, an XNOR gate 264 is used. This XNOR gate 264 comprises a conventional CMOS transistor arrangement using low voltage devices. The XNOR gate 264 has two inputs and one output. The first input is connected to the IN signal 216. The second input is connected to the INB signal 217. The XNOR outout is GATE3 268 and is connected to the gate of the transistor MN4 260. During steady state, when IN 216 is unchanging, the inputs to the XNOR 264 are either 0 and 1 or 1 and 0. Therefore, the output of the XNOR 264 is VSS.

Figure 4:
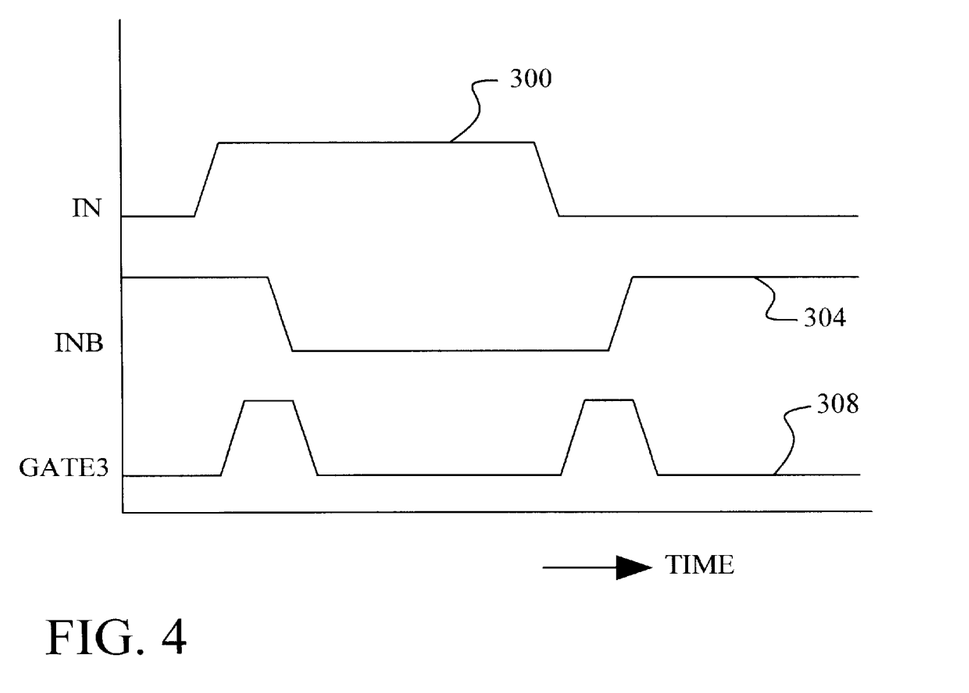
FIG. 4 graphically illustrates the signal timing of the second preferred embodiment of the present invention.

Referring now to FIG. 4, when a transition occurs at circuit input IN 300, for example, when IN rises from VSS to VCCL, then this signal change will propagate through the inverter. However, a delay occurs before INB 304 falls. During the delay time, both IN 300 and INB 304 are high. The logic requirement for the XNOR gate is thereby satisfied so that the GATE3 node 308 is driven high. Note that the XNOR gate is constructed to switch more quickly than the inverter. Once the inverter does switch, the XNOR gate senses a return to the steady-state condition where IN 300 and INB 304 are of opposite states. GATE3 308 is driven back to VSS. The pulse generated by the transition pulse circuit is typically between about 0.2 nanoseconds and 0.3 nanoseconds.

Referring once again to FIG. 3, the gate of transistor MN4 260 is connected to GATE3 268. The drain and source of MT4 260 are connected to the OUTB 218 and OUT 220 nodes, respectively.

The second embodiment level shifting circuit exhibits dc voltage and transistor switching characteristics according to Table 3 below:

TABLE 3

| IN | INB | OUT | OUTB | MN1 | MP1 | MN2 | MN3 | MP2 | MP3 | GATE3 | MN4 |
|---|---|---|---|---|---|---|---|---|---|---|---|
| VSS | VCCL | VSS | VCCH | OFF | ON | OFF | ON | ON | OFF | LOW | OFF |
| VCCL | VSS | VCCH | VSS | ON | OFF | ON | OFF | OFF | ON | LOW | OFF |

Note that the level shifting circuit exhibits no dc static current consumption. Only one transistor of the inverter pair MN1 236 and MP1 240 is ON in either state. Therefore, there exists no static current path from VCCL 224 to VSS 228. Since only the pair MN2 244 and MP3 256 or the pair MN3 248 and MP2 252 are ON at any given time, there exists no static current path between VCCH and VSS. The XNOR gate 264 exhibits no static current. Finally, MN4 260 is OFF during steady state. Note also that the high supply voltage VCCH 112 is only applied to the thick oxide devices MN2 244, MN3 248, MP2 252, MP3 256, and MN4 260. Therefore, reliability concerns for the thin oxide devices are eliminated.

To illustrate the ac performance of the second embodiment of the level shifting circuit, consider again the case of the input signal IN 216 switching from VSS to VCCL. First, the rise in gate voltage turns transistor MN2 244 ON. At this point, transistor MP2 252 also remains ON since the pre-switching bias of OUT 220 was low. Therefore, as in the prior art, the initial condition of the left side of the differential pair, after IN 216 switches states, is that MN2 244 is driving node OUTB 98 to VSS while MP2 252 is concurrently driving node OUTB 98 to VCCL.

As previously described, the transition pulse circuit 264, herein comprising an XNOR gate 264, will drive the GATE3 node to VCCL soon after IN 216 transitions to VCCL. Transistor MN4 260 is therefore turned ON to cause the OUT node 220 to be shorted to the OUTB node 218. A dynamic voltage equalization occurs between nodes OUTB 218 and OUT 220. The voltage on OUT 220 is thereby pulled from VSS up to a higher voltage, typically in the range of between about 0.5 Volts and 1.2 Volts. By introducing this voltage step on the OUT node 220, the gate drive of MP2 252 is reduced. The $I_{dsat}$ of MP2 252 is thereby reduced so that MN2 244 can effectively drive OUTB to VSS more quickly. In addition, the OUTB node 218 is driven lower through the path of MN4 260 and MN3 248 during this short transition time. Transistor MP3 256 begins to conduct and pull OUT 220 higher. This also causes the gate drive on MP2 252 to be reduced.

Once the inverter transistors, MN1 236 and MP1 240, finally drive INB 217 to VSS, then transistor MN3 248 is turned OFF. The pulse transition circuit 264 senses that IN 216 and INB 217 have returned to a steady-state condition and GATE3 268 is driven back to VSS. Once MN2 244 discharges the capacitance on OUTB 218 to VSS, transistor MP3 256 is turned ON. MP3 256 drives the output node OUT 220 to VCCH and completely turns OFF MP2 252.

The case where IN 216 switches from VCCL to VSS works in similar fashion with transistor MN4 141 working as a dynamic voltage equalizer to step up the voltage on the OUTB node 218 and thereby reduce the $I_{dsat}$ of MP3 256.

The analysis of the ac operation of the second embodiment level shifting circuit demonstrates how the design may be used in an ultra-deep submicron process to reduce switching delay. By adding dynamic voltage equalization through the transition pulse circuit 264 and transistor MN4 260, the problem of the low $I_{dsat}$ of thick gate NMOS inout devices, MN2 244 and MN3 248, is fixed. The circuit will switch faster and demonstrates symmetric switching delays.

In addition, for a given switching speed requirement, MN2 244 and MN3 248 may be made substantially smaller than would be necessary in the prior art design. Even with the addition of the transition pulse circuit 264 and the transistor MN4 260, the layout area required for the level shifting circuit is reduced.

As shown in the preferred embodiments, the present invention provides an effective method for increasing the switching speed of the level shifting circuit. In addition, for a given speed requirement, the area of the level shifting circuit can be reduced because the size of the high voltage NMOS input transistors could be reduced. One embodiment adds a dynamic current compensation to the level shifting circuit. A second embodiment adds a dynamic voltage equalization to the level shifting circuit.

While the invention has been particularly shown and described with reference to the preferred embodiments thereof, it will be understood by those skilled in the art that various changes in form and details may be made without departing from the spirit and scope of the invention.

What is claimed is:

1. A level shifting circuit comprising:
   a circuit input that swings between a low supply and ground;
   a circuit output that swings between a high supply and said ground;
   an inverter with input connected to said circuit input and output forming inverted circuit input;
   a first NMOS transistor with gate connected to said circuit input and with source connected to said ground;
   a first PMOS transistor with gate connected to said circuit output, with source connected to said high supply, and with drain connected to said first NMOS transistor drain;
   a second NMOS transistor with gate connected to said inverted circuit input, with source connected to said ground, and with drain connected to said circuit output;
   a second PMOS transistor with gate connected to said first NMOS transistor drain, with source connected to said high supply, and with drain connected to said circuit output;
   a third NMOS transistor with gate connected to said first NMOS transistor drain, with source connected to said circuit input, and with drain connected to said circuit output; and a fourth NMOS transistor with gate connected to said second NMOS transistor drain, with source connected to said inverted circuit input, and with drain connected to said first NMOS transistor drain.

2. The circuit according to claim 1 wherein said inverter comprises an NMOS transistor and a PMOS transistor.

3. The circuit according to claim 2 wherein said NMOS transistor and said PMOS transistor are low voltage transistors.

4. The circuit according to claim 1 wherein said first NMOS transistor, said second NMOS transistor, said first PMOS transistor, and said second PMOS transistor are high voltage transistors.

5. The circuit according to claim 1 wherein said third NMOS transistor and said fourth NMOS transistor are high voltage transistors.

6. The circuit according to claim 1 wherein said low supply is between about 0.5 Volts and 2.5 Volts.

7. The circuit according to claim 1 wherein said high supply is between about 1 Volt and 30 Volts.

* * * * *